United States Patent [19]

Weight et al.

[11] 4,439,809
[45] Mar. 27, 1984

[54] ELECTROSTATIC DISCHARGE PROTECTION SYSTEM

[75] Inventors: Merle E. Weight, Coon Rapids; Theodore S. Swenson, Isanti, both of Minn.

[73] Assignee: Sperry Corporation, New York, N.Y.

[21] Appl. No.: 351,089

[22] Filed: Feb. 22, 1982

[51] Int. Cl.³ .............................................. H05F 3/02
[52] U.S. Cl. ................................. 361/220; 339/14 R; 339/17 M; 361/413
[58] Field of Search ............... 361/212, 395, 412, 413, 361/415, 399, 220; 339/14 R, 17 LM, 17 M

[56] References Cited

U.S. PATENT DOCUMENTS

| | | | |
|---|---|---|---|
| 3,406,368 | 10/1968 | Curran | 339/17 M |
| 3,973,817 | 8/1976 | Stalley et al. | 339/14 R |
| 3,987,344 | 10/1976 | Ambruoso, Sr. et al. | 339/17 M X |
| 4,313,147 | 1/1982 | Uchida et al. | 361/119 |

FOREIGN PATENT DOCUMENTS 2259577  6/1974  Fed. Rep. of Germany .... 339/14 R

*Primary Examiner*—Reinhard J. Eisenzopf
*Attorney, Agent, or Firm*—Charles A. Johnson; Kenneth T. Grace; Marshall M. Truex

[57] ABSTRACT

A system and method for protecting electrostatic sensitive devices from damage caused by electrostatic discharge therethrough when being placed in electrical interconnection in an operating system is described. Electrostatic sensitive devices are mounted on a printed circuit carrier and have all ground circuits electrically connected to a common juncture. A guide block for cooperating with a guide pin during insertion is mounted on the printed circuit assembly. All guide pins are electrically coupled in common to a discharge potential. A spring contact is mounted in the guide block and electrically coupled to the common juncture, and is arranged for making contact with the guide pin prior to electrical contact of any signal pins with any connector terminals, whereby static charge is discharged through the discharge path without causing damage to the electrostatic sensitive device.

7 Claims, 11 Drawing Figures

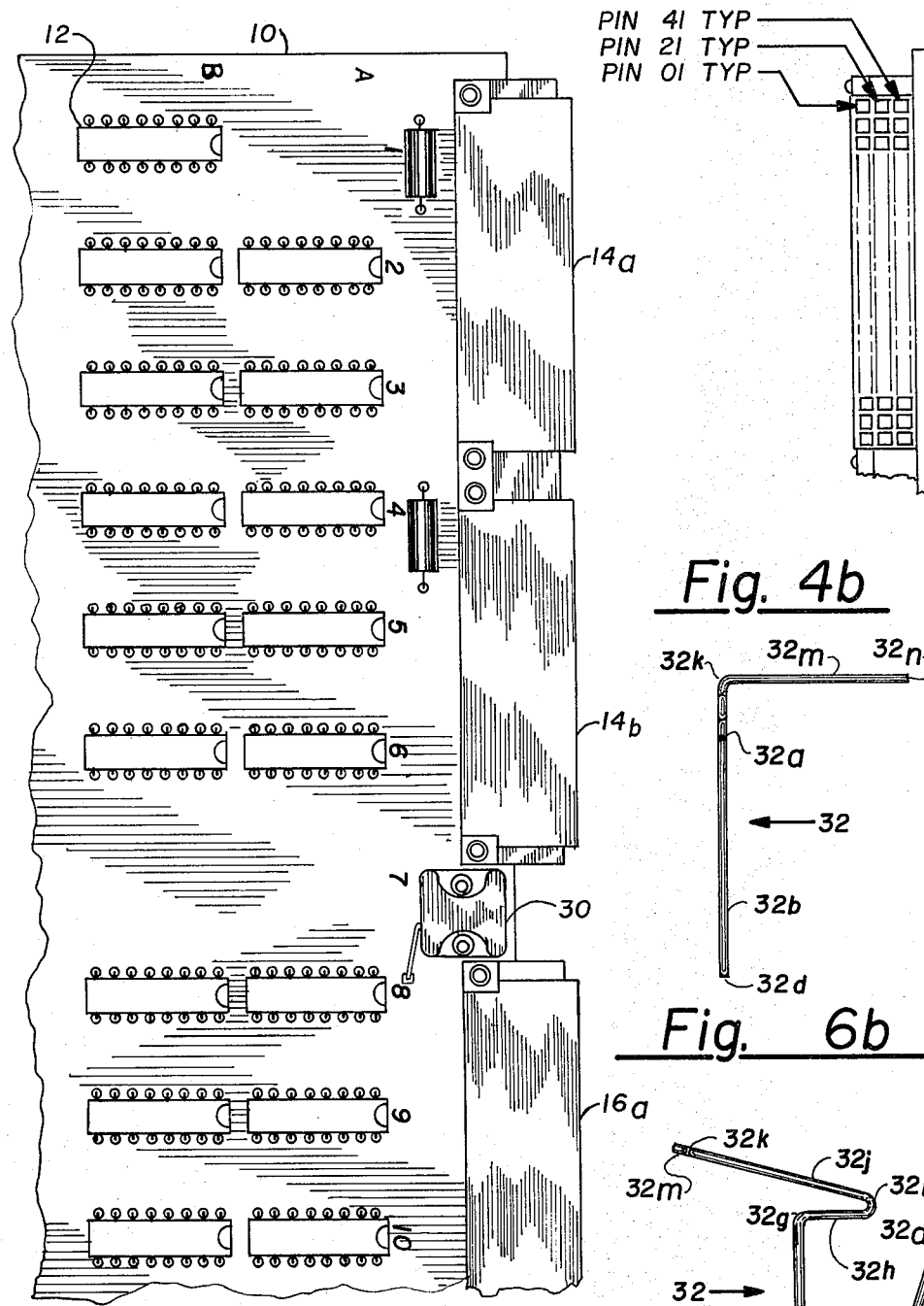
Fig. 4a
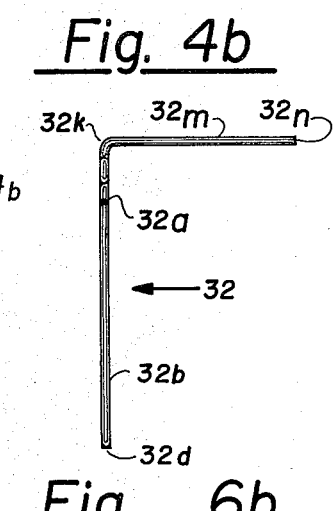
Fig. 4b
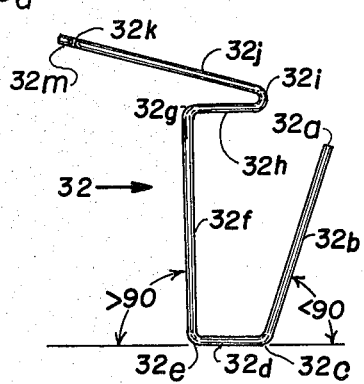
Fig. 6b
Fig. 6a

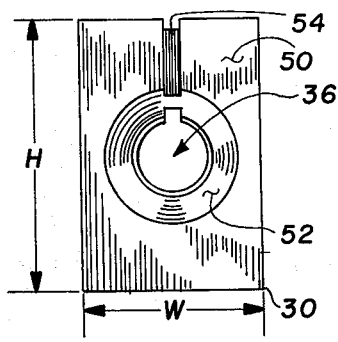
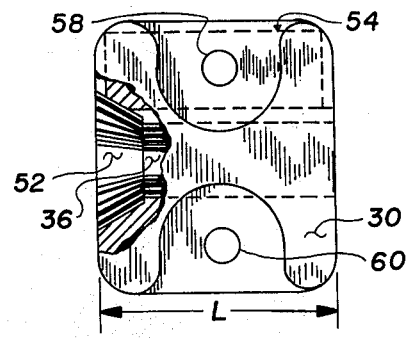
Fig. 5a  Fig. 5b
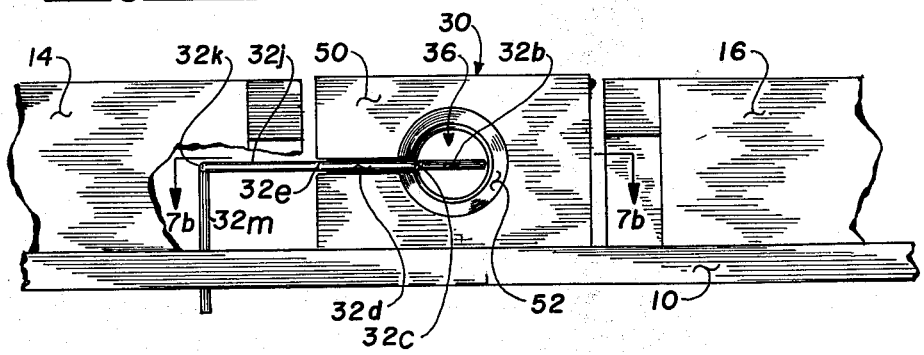
Fig. 7a
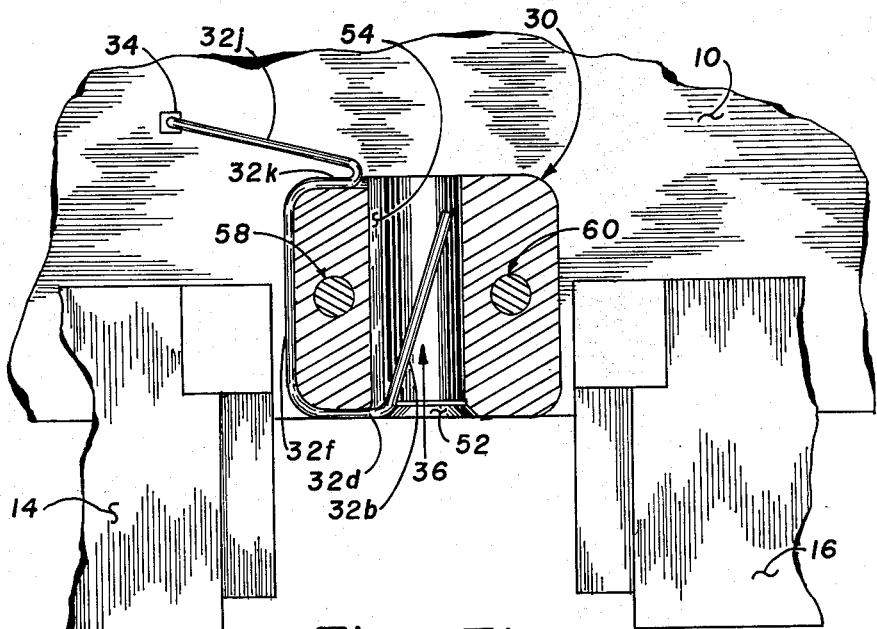
Fig. 7b

ELECTROSTATIC DISCHARGE PROTECTION SYSTEM

BACKGROUND OF THE INVENTION

1. Field of the Invention

This invention relates to the system and method for protecting microelectronic circuitry from damage that can be caused by electrostatic discharge therethrough while being placed in electrical interconnection in an operating system. More particularly, it relates to a system for predischarging electrostatic charge that may be present on printed circuit assemblies prior to insertion in an associated connector, thereby protecting Electrostatic Sensitive Devices that may be mounted thereon from damage or destruction.

2. State of the Prior Art

It has been recognized that with the advent of microcircuitry, including the use of integrated circuitry, an ever-increasing problem of damage or destruction has resulted from inadverdent electrostatic discharge therethrough. These Electrostatic Sensitive Devices (ESD) includes circuits incorporating metal oxide semiconductors, field effect transistors, complementary metal oxide semiconductors, and the like. Electrostatic Discharge damage has been detected in many logic family arrangements, and in particular, considerable testing and evaluation has gone forward regarding the 10K ECL logic family. Problems are known to exist in gate protected MOSFETS, input protected MOS Dynamic RAMS and TTL Logic Gates. The Advancement of integrated circuitry technology has resulted in many more devices being susceptible to electrostatic discharge damage because higher densities and smaller sizes results in less physical isolation between metalizations and thinner oxides separating diffusion layers. It is common for the ESD circuits to be mounted on printed circuit (PC) boards for making electrical interconnections through connectors mounted in a back panel assembly in the electronic device.

The nature of the damage or destruction to the ESD resulting from electrostatic discharge therethrough has been studied and reported in various technical journals. Suffice it to say that there can be damage or destruction of the input circuit, or the output circuit, depending upon the electrostatic discharge path. The undesired electrostatic discharge through the ESD can occur in several ways. For example, if a terminal of the ESD is inadvertently touched by an undischarged human, there is normally sufficient electrostatic charge on the body to damage or destroy the circuit. It is not uncommon for an electrostatic charge of 2,000 volts to be on a human, the discharge of which is normally below the feeling of sensation to the person, but is more than adequate to destroy an ESD circuit. Under proper conditions the charge on the human body can raise to the level of 5,000 to 6,000 volts, which is normally at the level when a "shock" is felt when it is discharged. The electrostatic discharge can also occur when the ESD is brought into contact with some other object that is in a condition to cause electrostatic discharge. For example being placed on a work table that is not properly protected can cause the electrostatic discharge to the ESD. Further, inserting the PC board into a back panel without protection for the electrostatic discharge can cause damage or destruction of the ESD.

ESD failure analysis indicates that 40 to 50% of the failures occur as a result of uncontrolled electrostatic discharge through the ESD. Damage can occur during manufacturing process, during handling while shipping and moving, and upon insertion into the device with which the ESD is to function. Fixed electrostatic-free work stations have been utilized for a considerable period of time, and involve the use of conductive table tops that are provided with the suitable grounding system, in conjunction with a grounding system for the personnel. The grounding system for the personnel at the work station often involves the use of a conductive wrist strap for draining away electrostatic charge. It is also common to utilize a conductor impregnated floor in conjunction with metallic elements worn on the feet of personnel for draining away the electrostatic charge. During shipping, it has been advantageous to protect the ESD circuits by placing them in bags constructed of electrostatic protective materials of which there are several varieties providing a variety of protection levels. For shipping, containers having conductive carbon black particles coated thereon for shielding against electrostatic charge from outside the container to the ESD circuits therein is described in U.S. Pat. No. 4,293,070. Finally, there is the damage or destruction that can be caused during insertion of the PC board in the cabinet that contains the ESD circuits. Characteristically, protection has been attempted to be afforded by personnel again wearing conductive grounded wrist straps to drain away electrostatic charge from the person. It has been determined that if the person is not grounded, a charge can be transferred to the assembly. Sliding the PC board in guide channels that are often constructed of a plastic or nylon material does not discharge electrostatic charge and damage to the ESD is caused when a connector pin makes contact and discharges the electrostatic charge.

The conductive wrist strap provided an impediment to free movement, and in a field condition may be resisted by personnel involved with maintenance and operation of the system. Once recognized, the problem of providing electrostatic free shipping containers and controlled work stations for manufacturer and repair can be quite readily provided, controlled, and maintained. However, the problem of field insertion of the PC board with its attendant electrostatic discharge problem is the least easy to subject to on-going control.

SUMMARY OF THE INVENTION

The invention is a system for protecting electrostatic sensitive devices from damage or destruction from the discharge of an electrostatic charge when plugging the supporting printed circuit assembly into back panel connectors by providing an electrostatic discharge path that is electrically connected prior to any signal contact being brought into electrical connection with the back panel connector. The ESD circuits are mounted on a printed circuit carrier board assembly, and all ground circuits are electrically connected to a common juncture. A centering block, sometimes referred to as a guide block, having an aperture therethrough for cooperation with a guide pin mounted on the back panel is mounted on the printed circuit assembly, and functions to align the contacts on the printed circuit board with the connector on the back panel when the printed circuit assembly is inserted. An electrical contact has one end electrically connected to the common juncture and has a spring loaded end arranged in the aperture for making electrical contact with the associated guide pin as the printed circuit assembly is inserted. The guide pin is sufficiently long to make contact with the spring contact prior to any of the circuit terminals coming in contact with the connector terminals. The guide pin is electrically connected to an electrostatic discharge ground paths such that when the guide pin comes in contact with the spring contact, all of the electrostatic charge on the printed circuit assembly is discharged through the electrostatic discharge path rather than through any of the signal contacts, thereby protecting the ESD circuits from damage or destruction resulting from such discharge. A plurality of printed circuit assemblies, each having an associated centering block with its associated spring contact, is similarly protected through the use of a plurality of guide pins all of which are electrically coupled in common to the electrostatic discharge path.

OBJECTS

A primary object of the invention is to provide an improved system for protecting electrostatic sensitive devices from damage or destruction resulting from electrostatic discharge therethrough.

Still another object of the invention is to provide an electrostatic discharge path that will protect electrostatic sensitive devices by preventing the electrostatic discharge therethrough when being inserted in an electronic circuit assembly.

Another object is to provide a system to discharge electrostatic charges from printed circuit assemblies containing electrostatic sensitive devices immediately prior to insertion in back panel connectors.

Still a further object of the invention is to provide an improved electrostatic discharge system for use with electrostatic sensitive devices that is independent of other user protection systems and provides protection in a field maintenance environment.

Yet another object of the invention is to provide an improved electrostatic discharge system that is reliable and low in cost of implementation. These and other more detailed and specific objectives will become apparent in the consideration of the drawings and the detailed description of the preferred embodiment.

BRIEF DESCRIPTION OF THE DRAWINGS

FIG. 4a is an illustrative layout pattern of a plurality of electrostatic sensitive devices on a portion of printed circuit board;

FIG. 4b illustrates a characteristic connector pin layout for the printed circuit assembly of FIG. 4a;

FIG. 5a is a leading edge elevation view of the centering block and contact support of the present invention;

FIG. 5b is a side elevation view of the centering block of FIG. 5a;

FIG. 6a is a top view of the contact clip;

FIG. 6b is a side elevation view of the contact clip of FIG. 6a;

FIG. 7a is an end elevation view of the centering block and spring contact assembly mounted to a printed circuit board; and FIG. 7b is a sectional view along line 7b—7b of FIG. 7a.

DESCRIPTION OF THE PREFERRED EMBODIMENT

Figure 1:
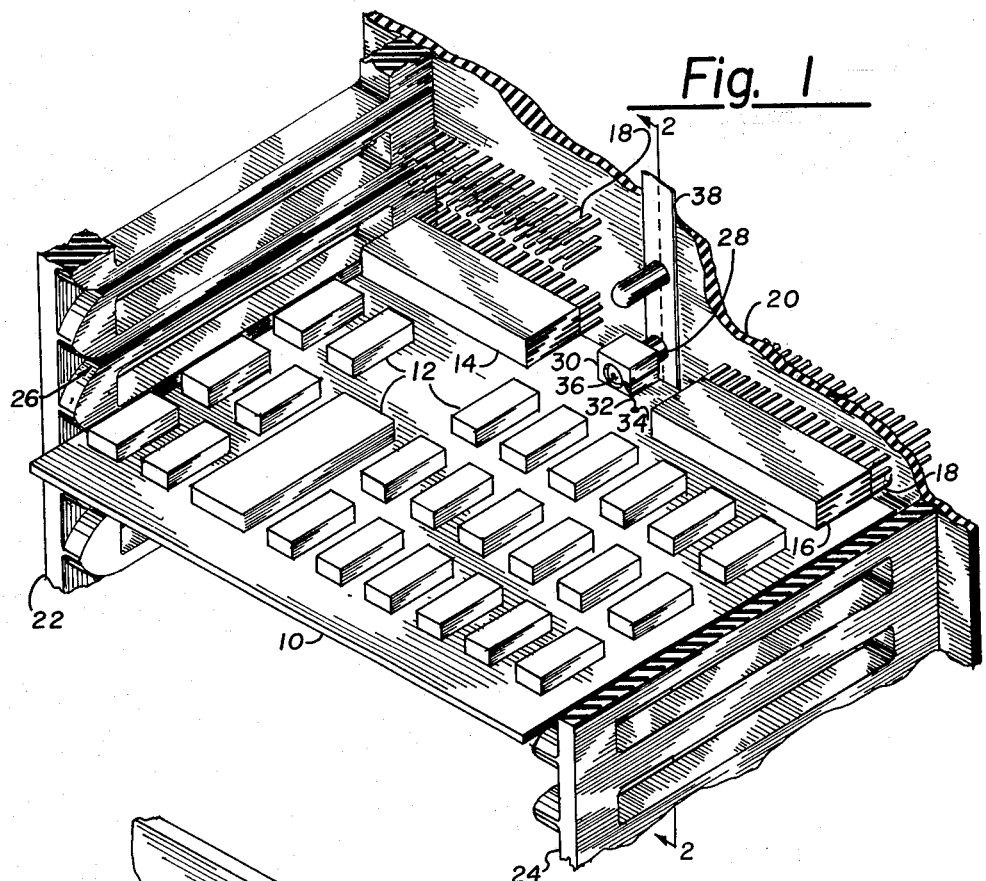
FIG. 1 illustrates a system environment for electrostatic sensitive devices and the electrostatic discharge protection system for a plurality of printed circuit assemblies.

FIG. 1 illustrates a system environment for electrostatic sensitive devices and electrostatic discharge protection system for a plurality of printed circuit assemblies. A printed circuit assembly (PC) 10 is shown illustratively for supporting a plurality of electrostatic sensitive devices (ESD) 12, which are arranged in a predetermined configuration on the PC board 10. Interconnection between ESD's are via printed circuit interconnections on the layers of PC board 10. These interconnections are not shown in detail, and are well known in the art. The PC board is fitted with electrical connectors 14 and 16, two such connectors being shown illustratively, it being understood that more or fewer connectors can be utilized. The connectors 14 and 16 are utilized for making electrical circuit interconnection with a plurality of connector pins 18, mounted in back panel 20, which is shown broken away. Card guides 22 and 24 are shown partially cut away, and are adapted for supporting the edges of the PC board as it is inserted into the system for making connection with the pins 18 in back panel 20. Only one PC board is shown, it being understood that a plurality of PC boards would normally be associated with the back panel 20, and would be inserted in associated slots, as illustrated by arrow 26, in the respectively associated card guides 22 and 24. A guide pin 28 is mounted in the back panel 20 for each of the associated PC boards. A guide block 30 is mounted on the PC board and is adapted for cooperation with the associated guide pin 28 for aligning the PC board for insertion of the pins 18 in the associated connector receptical. The guide block 30 is alternatively referenced as a centering block, centering member, or centering means. The guide block has a contact clip 32 mounted thereon and adapted for making electrical contact at point 34 with a junction on the PC board. A spring contact within cavity 36 is adapted for making electrical contact with this associated guide pin 28 as the PC board is inserted in the system. A ground strip 38 is mounted on the back panel 20 and in electrical contact with all of the guide pins 28. The ground strip is appropriately grounded such that when the card is inserted, the spring contact 32 in guide block 30 will make contact with the associated guide pin 28 and discharge any electrostatic charge on the PC board prior to making electrical contact between pins 18 and the associated connector terminals. All of these structures will be described in more detail below. It is of course understood that structural elements placements can be altered, for example the connectors 14 and 16 could be mounted to the back panel with pins 18 suitably mounted on the PC board 10. Similarly, the guide block 30 could be mounted on the back panel 20, with an appropriate structure for mounting the guide pins to the associated PC boards. For such an alteration, it would be necessary to electrically connect the guide pin to the common juncture 34, and to electrically connect all of the contact clips 32 to the ground strip 38.

Figures 2, 3:
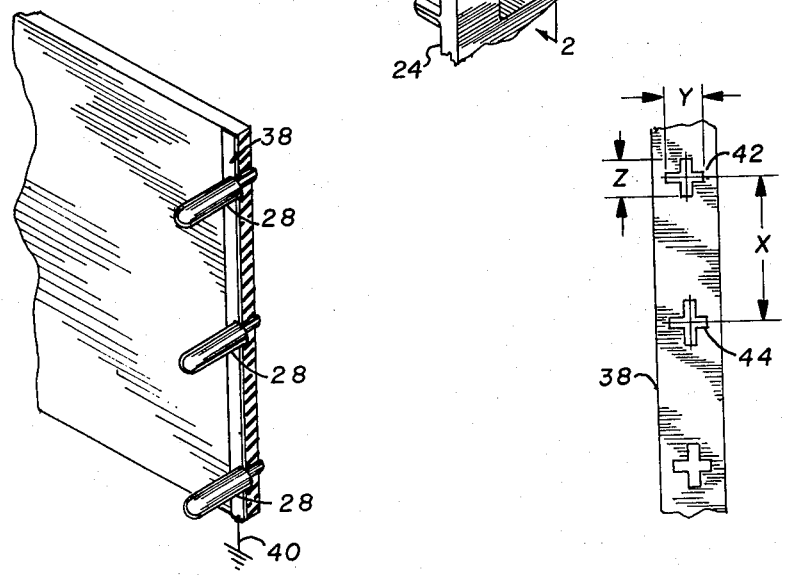
FIG. 2 is a view taken along line 2—2 in FIG. 1, and illustrates electrical interconnection of a plurality of guide pins.
FIG. 3 illustrates a portion of conductive ground strip for interconnecting a plurality of guide pins.

FIG. 2 is a view taken along line 2—2 in FIG. 1, and illustrates the electrical interconnection of a plurality of guide pins 28 to the ground strip 38, with the ground strip being coupled to ground potential 40. The ground potential 40 provides the discharge path for the electrostatic discharge.

FIG. 3 illustrates a portion of a conductive ground strip for interconnecting a plurality of guide pins. The segment of ground strip 38 has a plurality of cross shaped openings stamped therein, two such cross shaped openings 42 and 44 being illustrated. The cross shaped openings 42 and 44 are stamped on centers X, where X is the center to center spacing of the guide pins 28. For one characteristic embodiment, X is 0.5 inch. The ground strip is characteristically a bronze strip 0.008 inch in thickness having a tin finish deposit thereon. The dimension of the cross shaped openings 42 are such that the Y and Z dimensions are selected as the diameter of the guide pin 28 with which it will be utilized. When fabricated, the ground strip 38 is forced over all of the guide pins 28 thereby making electrical contact with each of them. A characteristic embodiment of ground strip 38 would include a 36 cross shaped opening. It is of course apparent that a greater or lesser number of interconnected guide pins 28 could be utilized. It is also apparent that other electrical interconnection systems to connect the guide pins 28 in common could be utilized. The ground strip 38 has been found to be particularly advantageous for ease of construction, ease of installation, and reliability of electrical interconnect.

FIG. 4a is an illustrative layout pattern of a plurality of electrostatic sensitive devices on a portion of a printed circuit board, major portions of which have been cut away. The PC board 10 is laid out for mounting of ESD's in rows and columns. For the configuration shown, columns are alphabetically numbered A and B for the columns illustrated, it being understood that in one embodiment there are six such columns. Similarly, there are shown rows number 1 through 10, it being understood that in a characteristic embodiment there would be fourteen such rows. The placement and number of ESD's 12 will depend upon the particular PC board layout. The guide block 30 is mounted to the surface of the PC board 10. The precise embodiment utilizes two connector blocks 14a and 14b on one side of the guide block 30 and two connector blocks 16a and a second connector block (not shown) on the other side of the guide block 30.

FIG. 4b illustrates a characteristic connector pin layout for the printed circuit assembly shown in FIG. 4a, in particular the pin layout for connector block 14a. It illustrates the connector recepticals are arranged in three columns of twenty rows yielding sixty connector terminal contacts for each connector block. It is of course apparent that other connector arrangements can equally be utilized.

FIG. 5a is a leading edge elevation view of the centering block and contact support. The centering block, also referred to as the guide block, 30 is of molded plastic and has aperture 36 extending therethrough for receiving the associated guide pin 28. The aperture 36 is illustrated as round for use with a round guide pin, it being understood that a different shaped guide pin, for example square, would result in the aperture 36 being adjusted to a similar cross section that would allow sliding contact with the associated guide pin. At the leading surface 50 there is an annular cavity 52 surrounding the aperture 36 for allowing protrusions from the ground strip 38 surrounding the guide pin to be received within the guide block 30 such that the leading surface 50 can come into close contact with the surface of the ground strip 38. The annular cavity 52 also acts as additional guiding system to direct the tip of the associated guide pin into the aperture 36 since the annular cavity 52 has sloped sidewalls, thereby tending to prevent the associated guide pin from being stopped by the leading surface 50 when slightly out of alignment with aperture 36. A slot 54 extends axially along the length of aperture 36, across the leading surface 50, along the length of the body of guide block 30, and down the trailing surface to the edge of aperture 36. The slot is utilized for receiving and providing a retention for the spring clip contact, as will be described in more detail below. For a characteristic embodiment, the guide block 30 has a width W of 0.33 inch and a height H of 0.5 inch, with a typical groove or slot of 0.02 by 0.02 inch.

FIG. 5b is a side elevation of the centering block of FIG. 5a, and illustrates a portion cut away to expose the annular cavity 52 and aperture 36. A pair of holes 58 and 60 are utilized to receive screws for mounting the guide block 30 to the base of the PC board. The location of slot 54 is illustrated by dashed line 54. For a characteristic embodiment, the guide block 30 has a length L of 0.44 inch.

FIG. 6a is a top view of a contact clip referenced as contact 32 in FIG. 1. For a preferred embodiment, the contact 32 is constructed of round copper beryllium alloy wire having a diameter of 0.016 inch and fashioned for cooperation with the guide block 30. The spring contact member referenced generally as spring member 32 has a first end 32a that defines one end of a first segment 32b and having a length less than the length of aperture 36. Characteristically, a length of 0.4 inch functions satisfactorily with the guide block shown in FIG. 5a and FIG. 5b. The first segment 32b bends at a first bend point 32c at less than right angles in a predetermined plane, and extends to a second segment 32d which extends to a second bend point 32e. The length of the ground segment 32d is essentially the length of the groove in the leading edge of guide block 30. The wire 32 is bent at second bend point 32e at more than right angles and extends to a third segment 32f which continues in the same plane to a third bend point 32g. A fourth segment 32h extends in the same plane from bend point 32g to a fourth bend point 32i. The arrangement is such that the positioning of segment 32d, 32f, and 32h, in slot 54 of the guide block 30 results in the spring contact 32 gripping block 30, and being held in physical contact therewith. The arrangement is such that segment 32b is situated in aperture 36, and when deflected by an associated guide pin will be deflected into the axial groove in aperture 36, illustrated in FIG. 5a and FIG. 5b. A fifth segment 32j deflects in the same plane at the bend point 32i, and extends to a fifth bend point 32k. A sixth segment 32m deflects out of the plane at bend point 32k and extends a predetermined distance for making contact with the printed circuit board 10 at juncture 34 as shown in FIG. 1. The length of segment 32m is greater than one-half the width of the centering block 30.

FIG. 6b is a side elevation view of the contact clip of FIG. 5a and illustrates segment 32m extending to the second end 32n of the wire clip.

FIG. 7a is an end elevation view of the centering block and spring contact assembly mounted on a printed circuit board. The guide block 30 is mounted on PC board 10 with its leading surface 50 and annular cavity 52 exposed. The electrical contact spring clip reference generally by numeral 32 has its contact segment 32b shown disposed within aperture 36. The segments and bend points described in conjunction with FIG. 6a that are visible are given the same reference numerals. Connector blocks 14 and 16 are shown dashed and cut away for purposes of reference.

FIG. 7b is a sectional view taken along line 7b—7b of FIG. 7a. All elements that have been previously referenced have the same reference numerals applied and the cut away of centering block 30 illustrates the positioning of the contact segment 32b within aperture 36. The spring clip 32 has its end coupled to juncture 34 which is a common juncture wired on PC board 10, the wiring not being shown, that couples all ground circuits of the ESD's thereto, and provides the safe electrostatic discharge of the ESD's and all elements on the PC board when the guide pin comes in contact with spring contact 32b.

It is of course apparent that other configurations of the guide 30 and the spring contact 32 could be arranged, the primary requisite being that the contact end of spring contact 32 must come in electrical contact with the associated guide pin before any of the connector terminals are brought in an electrical contact with any of the back panel pins.

In view of the foregoing description of the inventive concepts, consideration of the drawings, and description of the preferred embodiment, it can be seen that the various stated purposes and objectives of the invention have been met. Without departing from the spirit and scope of the invention, what is intended to be protected by Letters Patent is set forth in the appended claims.

What is claimed is:

1. For use with an assembly for electrostatic sensitive devices having signal circuits, power circuits and ground circuits, an electrostatic discharge protection system comprising:

circuit board means for supporting electrostatic sensitive devices and for supporting conductors for making predetermined electrical interconnection of selected ones of said devices;

juncture means mounted on said circuit board means for providing an electrical common interconnection point;

circuit means for connecting all ground circuits to said juncture means;

contact means for providing a path of discharge of electrostatic charge, said contact means including electrically conductive spring means having a first portion for making electrical contact with said juncture means, a second portion, and a third portion for interconnecting said first and second portions;

centering means for centering said circuit board means and arranged for supporting said contact means and electrostatic charge dissipation means arranged for making contact with said contact means prior to any signal circuits being brought into contact for causing discharge of said electrostatic charge without causing damage to any of the signal circuits in the electrostatic sensitive devices, said electrostatic discharge dissipation means including electrically conductive guide pin means for cooperating with said centering means for making electrical contact with said second portion of said electrically conductive spring means as said guide pin means is moved into cooperative relationship to said centering means.

2. An electrostatic discharge system as in claim 1 wherein said centering means includes:

body means having an aperture therethrough, said aperture having a predetermined opening substantially the same as the cross-section of the guide pin means and arranged for said guide pin means to make sliding contact in said aperture; and said body means having first slot means extending the length of said aperture, said first slot means having a depth to receive said second portion of said electrically conductive spring means while holding said portion in contact with said guide pin means as said guide pin means is inserted in said aperture.

3. An electrostatic discharge system as in claim 2 wherein said body means further includes:

an annular cavity around said aperture extending a predetermined depth into said body means; and second slot means for cooperating with said third portion of said conductive spring means, said second slot means in cooperative relationship to said first slot means and arranged for said third portion to grip said body means in said second slot means.

4. An electrostatic discharge protection system as in claim 2 wherein said electrically conductive spring means includes;

a continuous spring member having first and second ends, a predetermined length, and said first portion, said second portion, and said third portion formed with a plurality of segments;

said first portion including a first segment commencing at said first end and having a length less than the length of said aperture and extending to a first bend point, said first segment arranged for use in said aperture in said body means to contact said guide pin when inserted therein;

said third portion commencing at said first bend point and including a second segment deflecting in a plane at less than right angles to said first segment at said first bend point, and extending to a second bend point, the length of said second segment to extend from the edge of said aperture in said body means to the external surface thereof;

a third segment deflecting in said plane at more than a right angle to said second segment at a second bend point, and extending to a third bend point, the length of said third segment to extend from one end of said body means to the other end thereof, and arranged for use substantially parallel to the longitudinal axis of said aperture therein;

a fourth segment deflecting in said plane at more than a right angle to said third segment at said third bend point, and extending to a fourth bend point, said second and fourth segments for gripping respectively associated ends of said body means when associated therewith;

a fifth segment deflecting in said plane at a predetermined angle at said fourth bend point and extending a first predetermined distance to a fifth bend point; and said second portion including a sixth segment deflecting out of said plane at a second predetermined angle at said fifth bend point, said sixth segment extending a predetermined distance to said second end, said second predetermined distance being greater than one-half the width of said body means and for use in making electrical contact to said junction means.

5. An electrostatic discharge system as in claim 14 and further including:
   a plurality of said circuit board means;
   a plurality of said contact means each for coupling to said juncture means on an associated different one of said circuit board means;
   a plurality of said centering means, each for supporting an associated one of said contact means; and
   a plurality of said guide pin means coupled in electrical common in said electrostatic charge dissipation means, each for cooperating with an associated different one of said plurality of contact means.

6. An electrostatic discharge system as in claim 5 wherein said plurality of said guide pin means coupled in common includes:
   electrical conductive means coupled to each of said guide pin means and
   ground means coupled to said electrical conductive means for providing a discharge path.

7. An electrostatic discharge system as in claim 1, said centering means comprising:
   body means having a predetermined width, depth and height dimensions, a leading surface, a trailing surface, a first and second side surfaces, and, first and second end surfaces;
   an aperture intermediate said first and second side surfaces and said first and second end surfaces, said aperture having a predetermined opening substantially the same as the cross-section of said guide pin to be used therewith;
   an annular cavity around said aperature in said leading surface; and
   a slot having a width and depth to accommodate said contact means said slot extending along the length of said aperture, across the portion of said leading surface from said aperture to said first end surface, along said first end surface from said leading surface to said trailing surface, and across the portion of said trailing surface from said first end surface to said aperture.

* * * * *

UNITED STATES PATENT AND TRADEMARK OFFICE
CERTIFICATE OF CORRECTION

PATENT NO. : 4,439,809
DATED : March 27, 1984
INVENTOR(S) : Merle E. Weight, Theodore S. Swenson It is certified that error appears in the above-identified patent and that said Letters Patent are hereby corrected as shown below:

Column 9, Line 4, "14" should be -- 1 -- .

Signed and Sealed this

Twenty-eighth Day of August 1984

[SEAL]

Attest:

GERALD J. MOSSINGHOFF

Attesting Officer

Commissioner of Patents and Trademarks